United States Patent [19]
Lee et al.

[11] Patent Number: 5,747,871
[45] Date of Patent: May 5, 1998

[54] BIPOLAR TRANSISTOR HAVING A SELF-ALIGNED BASE ELECTRODE AND METHOD FOR MANUFACTURING THE SAME

[75] Inventors: Kyu-Hong Lee; Jin-Hyo Lee; Jong-Sun Lyu, all of Yusong-ku, Rep. of Korea

[73] Assignee: Electronics and Telecommunications Research Institute, Daejeon, Rep. of Korea

[21] Appl. No.: 696,256

[22] Filed: Aug. 13, 1996

[30] Foreign Application Priority Data

Dec. 15, 1995 [KR] Rep. of Korea ............... 1995-50517

[51] Int. Cl.$^6$ ............... H01L 27/082; H01L 27/102; H01L 29/70; H01L 31/11
[52] U.S. Cl. ............... 257/586; 257/552; 257/565
[58] Field of Search ............... 257/586, 517, 257/552, 557, 559, 565, 571, 594

[56] References Cited

U.S. PATENT DOCUMENTS

| | | | |
|---|---|---|---|
| 3,933,540 | 1/1976 | Kondo et al. | 257/586 |
| 4,149,915 | 4/1979 | Bohg et al. | 257/586 |
| 4,199,378 | 4/1980 | Van Gils | 257/586 |
| 4,318,751 | 3/1982 | Horg | 257/517 |
| 4,674,173 | 6/1987 | Hahn et al. | 257/517 |
| 4,698,127 | 10/1987 | Hideshima et al. | 257/517 |
| 4,887,145 | 12/1989 | Washio et al. | 257/586 |
| 4,892,837 | 1/1990 | Kudo | 257/586 |
| 4,969,026 | 11/1990 | Van der Velden et al. | |
| 5,496,745 | 3/1996 | Ryum et al. | 257/586 |

FOREIGN PATENT DOCUMENTS

| | | | |
|---|---|---|---|
| 0310087 | 4/1989 | European Pat. Off. | |
| 56-040275 | 4/1981 | Japan | 257/586 |

*Primary Examiner*—Sara W. Crane
*Assistant Examiner*—Phat X. Cao
*Attorney, Agent, or Firm*—Antonelli, Terry, Stout, & Kraus, LLP

[57] ABSTRACT

A bipolar transistor and a process for manufacturing thereof is disclosed. The bipolar transistor has a self-aligned base electrode in which first and second pillars are formed within first and second trenches which act as an activated region and a collector region, respectively; a conductive impurities layer of high density formed at a bottom side of the first and second trenches and at a lower portion of an isolation wall between the first and second trenches; and a sequentially formed base and emitter layer. After connection to the base layer, a base contact electrode is formed within the first trench, and a collector contact electrode is formed by implanting second conductive impurities in the second pillar.

6 Claims, 5 Drawing Sheets

BIPOLAR TRANSISTOR HAVING A SELF-ALIGNED BASE ELECTRODE AND METHOD FOR MANUFACTURING THE SAME

BACKGROUND OF THE INVENTION

1. Field of the Invention

The present invention relates to a bipolar transistor, and particularly to a bipolar transistor having a self-aligned base electrode and method for manufacturing the same which does not require a process of patterning a base electrode.

2. Description of the Prior Art

Conventionally, a bipolar transistor uses a structure for minimizing the base width to obtain a high cut-off frequency characteristic and low parasitic resistance, a structure for obtaining a low parasitic capacitance and a structure of using a trench to reduce the size of the transistor.

FIG. 1 is a cross-sectional view of a conventional bipolar transistor having a trench. It is shown in the European Patent No. EP 0 310 087. Referring to FIG. 1, 11 denotes a P-type substrate, 12 a P-type base electrode region, 13 an N-type collector region, and 14 a high density P-type element isolating region. Also, 16 indicates a P-type base region and 17 a high density N-type emitter region. Numbers 23E, 23B and 23C denote an emitter electrode, a base electrode and a collector electrode, respectively. Numbers 51 to 53 indicate an insulating film, and 43A and 43B are trenches. Moreover, 115 is a P-type base region, number 118 a N-type collector electrode and number 119 identifies a P-type polysilicon base electrode.

The conventional trench will be described as follows. An activated region of the substrate 11 is enclosed by trenches 43A and 43B, and a collector, an emitter and a base region are formed within the activated region. Also, the collector electrode is formed at the lower portion of a trench and the base electrode is formed at the upper portion of the same trench.

The characteristic of this structure is to minimize the size of the parasitic capacitance of the base and collector, and the size of an element.

However, the conventional bipolar transistor according to FIG. 1 has problems in that a silicon epitaxial layer of low density is formed on the impurities layer of high density, and the junction area of base electrodes is large.

SUMMARY OF THE INVENTION

Therefore, it is an object of the present invention to provide a bipolar transistor having a self-aligned base electrode which eliminates the process of patterning a base electrode from the conventional pillar-type bipolar transistor and minimizes the parasitic capacitance of a base electrode.

To achieve the above-mentioned object, a bipolar transistor having a self-aligned base electrode in accordance with the present invention includes a first conductive semiconductor substrate having first and second pillars formed in first and second trenches each having a predetermined depth for defining an activated region and a collector region of an element; a conductive impurities diffusing layer formed at the semiconductor substrate of the lower portion of the first and second trenches and at the isolation wall between the first and second trenches; a first conductive base layer formed from the first pillar to the upper portion of the second conductive impurities diffusing layer; a base contact electrode insulated from the second conductive impurities diffusing layer, connected to the base layer and formed within the first trench; a second conductive emitter layer formed on the base layer; and a collector contact electrode having a conductive type the same as the second conductive impurities diffusing layer and formed by the second pillar of the second trench.

The present invention includes forming first and second trenches each having a predetermined depth by a photolithography process and forming first and second pillars within the trenches; forming a second conductive impurities diffusing layer on the substrates of the lower portion of the first and second trenches and at the isolation wall between the first and second trenches forming a base layer by ion-implanting of the first conductive impurities into the first pillar; forming a base contact electrode which is contacted with the base layer within the first trench and insulated from the second conductive impurities diffusing layer; and a step for forming a second conductive emitter layer on the base region.

DESCRIPTION OF THE PREFERRED EMBODIMENT

Figure 1:
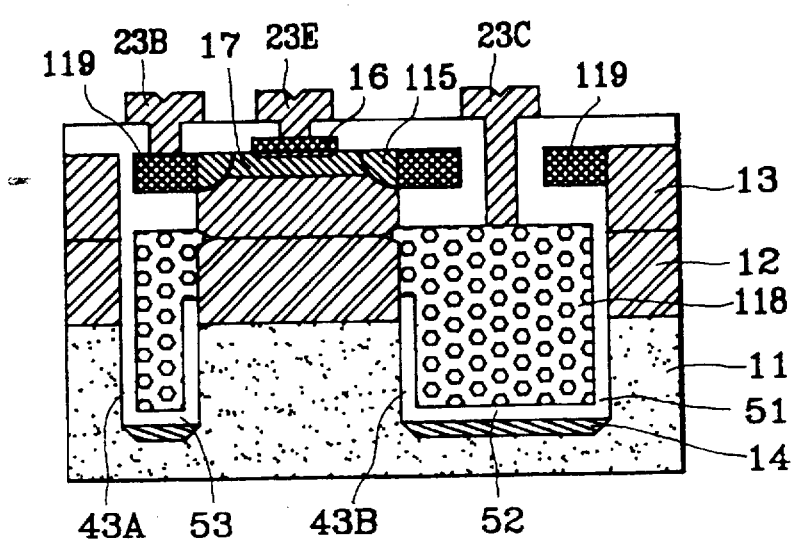
FIG. 1 is a cross-sectional view of a conventional bipolar transistor.
Figure 2:
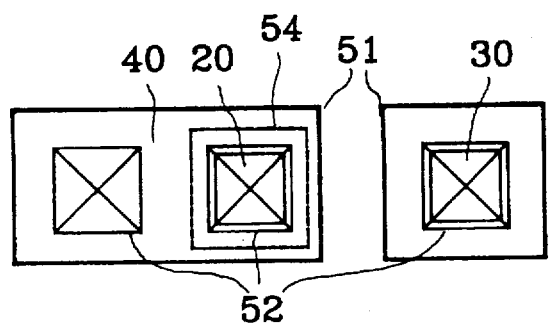
FIG. 2 is a layout plan view of a bipolar transistor according to the present invention.

The preferred embodiment will be explained by referring to the drawings as follows. FIG. 2 is a layout plan of a bipolar transistor according to the present invention. Referring to FIG. 2, an activated region 20, a collector region 30 and a base electrode region 40 of the transistor are defined by the first and second trenches.

That is, as shown in FIG. 2, the structure of a bipolar transistor according to the present invention is formed by defining a trench region 51, a polysilicon region 54 for an emitter and a metal lead connecting region 52.

Figure 3:
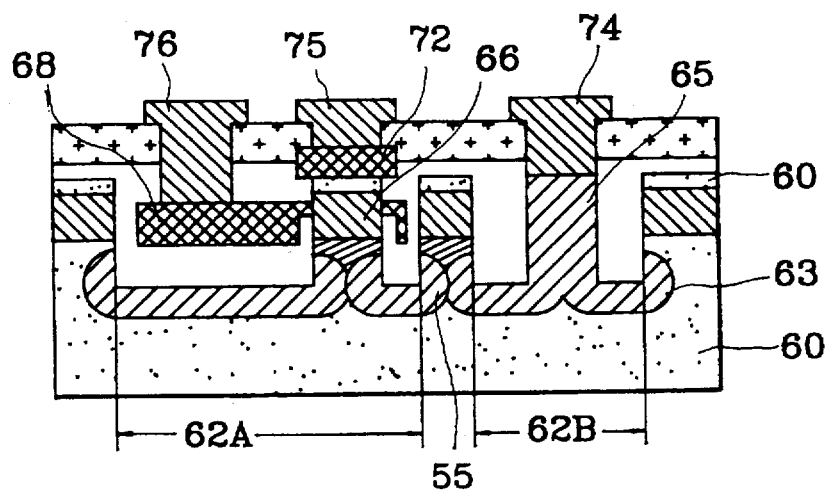
FIG. 3 is a cross-sectional view of a bipolar transistor according to the present invention.

FIG. 3 is a cross-sectional view of a bipolar transistor according to the present invention. Referring to FIG. 3, a bipolar transistor includes a first trench 62A on a P-type semiconductor substrate 60; and a second trench 62B.

According to the formation of the first and second trenches 62A and 62B, a first pillar 100A and a second pillar 100B are formed.

A second conductive N-type impurities diffusing area 63 of high density which conducts electrically and acts as a collector layer is formed at the bottom/side portion of the trenches and at the lower portion of the isolation wall 55 between the first and second trenches.

The first pillar which acts as an activated region is joined with a second conductive N-type impurities diffusing region 63, and a first conductive P-type base layer 66, a base contact unit 70, a second conductive polysilicon emitter layer 72 and an emitter electrode 75 are sequentially formed thereon.

A collector electrode contact region 65, which is doped with the second conductive impurities, is formed at the second pillar, and a collector electrode 74 is formed on the collector electrode contact region 65.

In addition, a first conductive polysilicon base electrode layer 68 which is connected with the first conductive P-type base layer 66 and insulated against the second conductive N-type impurities diffusing layer 63 by an insulating film, is formed within the first trench 62A. A base electrode 76 is formed on the base contact electrode. FIG. 4 to FIG. 9 are cross-sectional views showing a manufacturing process of a bipolar transistor having a self-aligned base electrode.

Figure 4:
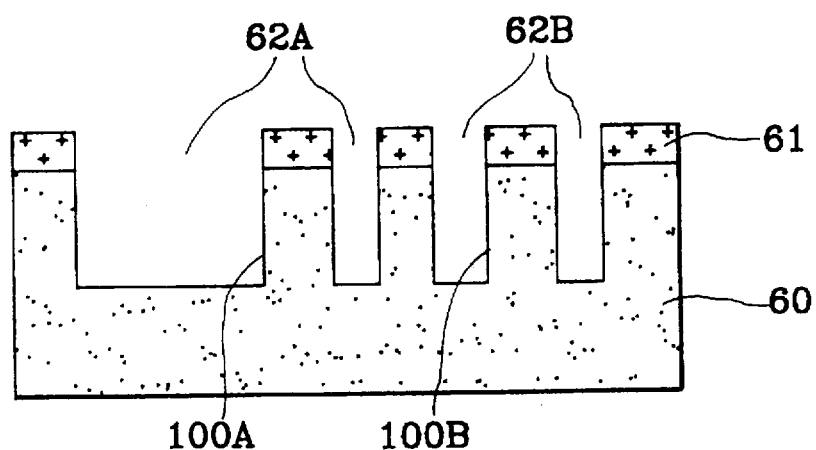
FIG. 4 to FIG. 9 are cross-sectional views showing a manufacturing process of a bipolar transistor having a self-aligned base electrode.

First, referring to FIG. 4, an oxide film 61 having a thickness of 2000 to 5000 Å is formed on the first conductive P-type silicon semiconductor substrate, and the oxide film 61 is removed in order to expose the predetermined portion of the semiconductor substrate by the photolithography method.

After that, the exposed semiconductor substrate 61 is etched by a dry type by using the oxide film as an etching mask, and the first and second trenches 62A and 62B each having a depth of 0.7 to 2.0 μm are formed.

According to the formation of the trenches 62A and 62B, a first pillar 100A as an activated region, and a second pillar 100B as a collector contact electrode are formed.

Figure 5:
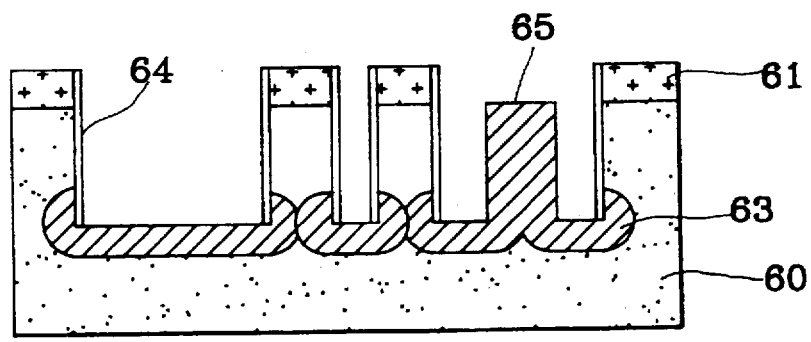

As shown in FIG. 5, an oxide film having a thickness of 2000 to 3000 Å is formed over the exposed surface of the substrate 60 and the oxide film at the bottom of the trenches 62A and 62B is removed by the anistropic dry etching, thereby a side wall oxide film 64 is formed. Moreover, by the photo mask process, the oxide film 61 remaining on the second pillar 100B and the side wall oxide film 64 are removed.

By using the wall oxide film 64 and the oxide film 61 remaining at the surface of the substrate and at the side walls of the first and second trenches as an impurities diffusing mask, the second conductive impurities having a density of $1\times10^{20}$ to $1\times10^{21}/cm^3$ are implanted in the substrate of the bottom of the first and second trenches 62A and 62B, in the bottom of the first pillar 100A, and in all over the second pillar 100B. Thereafter, heat treatment is performed, thereby the N-type impurities diffusing layer 63 of high density and the collector contact electrode 65 are formed.

At this time, the N-type impurities diffusing layer 63 of high density and the collector contact electrode 65 are formed so as to be electrically connected each other.

Figure 6:
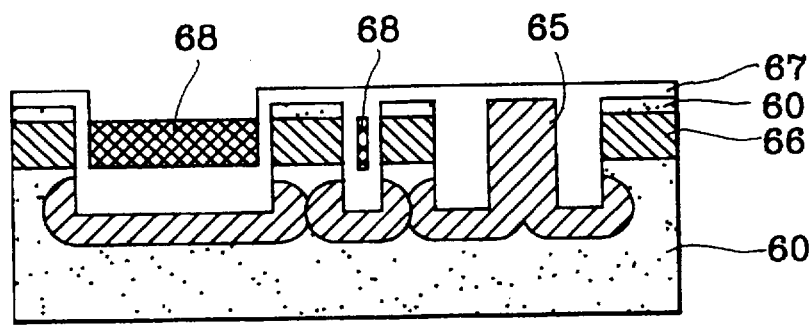

As shown in FIG. 6, after completely removing the remaining oxide film 61 and the side wall oxide film 64, by implanting the P-type impurities having a density of $5\times10^{16}$ to $1\times10^{18}/cm^3$ in all the surface of the substrate, the base layer 66 of P-type impurities layer is formed at a predetermined position of the substrate 60 and the first pillar 100A.

Thereafter, an oxide film 67 having a thickness of 0.1 to 1 μm is formed on the entire portion of the substrate.

At this time, the oxide film 67 is formed so as not to fill completely up the inside of the first trench 62A. On the contrary, the oxide film 67 is formed to completely fill up the inside of the second trench 62B.

When thermal-oxidizing the exposed substrate or forming the oxide film by using the CVD method as the area of the first trench 62A is wide, only the inside of the second trench 62B is completely filled up.

A polycrystalline silicon layer where P-type impurities used as a base contact unit is doped at a degree of $1\times10^{20}$ to $1\times1^{21}/cm^3$ is formed at the upper portion of the oxide film with a thickness of 0.1 to 3 μm.

Additionally, the polycrystalline silicon layer is polished by using the chemical mechanical polishing (termed hereinafter CMP). At this time, the oxide film 67 functions as a polishing barrier layer.

The base contact electrode 68 is formed by etching to a degree of 0.2 to 0.5 μm the polycrystalline silicon layer which is filled up in the first trench region 62A so as to be formed at a similar height as the base layer 66.

Figure 7:
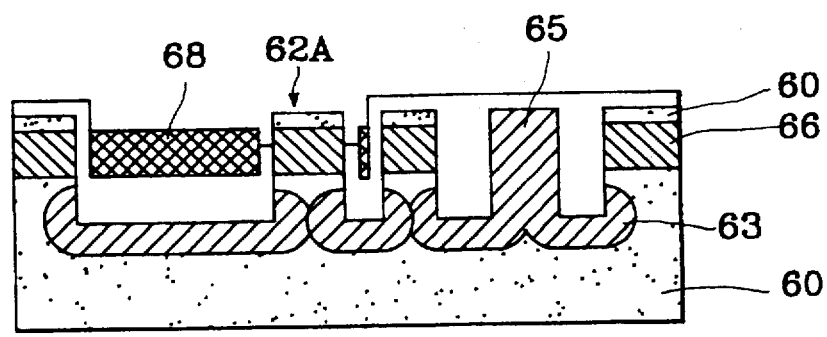

Thereafter, as shown in FIG. 7, by removing the oxide film 67 at the upper portion of the first pillar 100A, the side portion of the base contact electrode 68 and the base layer 66 are exposed.

Figure 8:
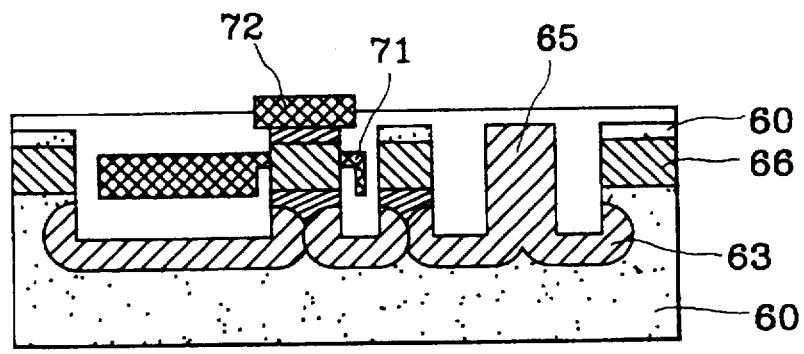

As shown in FIG. 8, the base layer 66 and the base contact electrode 68 are connected by deposition the polycrystalline silicon layer 71, and the oxide film is formed on the entire surface of the exposed substrate and the surface becomes even.

After removing the oxide film of the upper portion of the first pillar 100A and exposing the upper side of the base layer 66, a polysilicon emitter layer 72 where the N-type impurities are doped at a degree of $1\times10^{20}$ to $1\times1^{21}/cm^3$ is formed, having a thickness of 0.1 to 0.3 μm.

Figure 9:
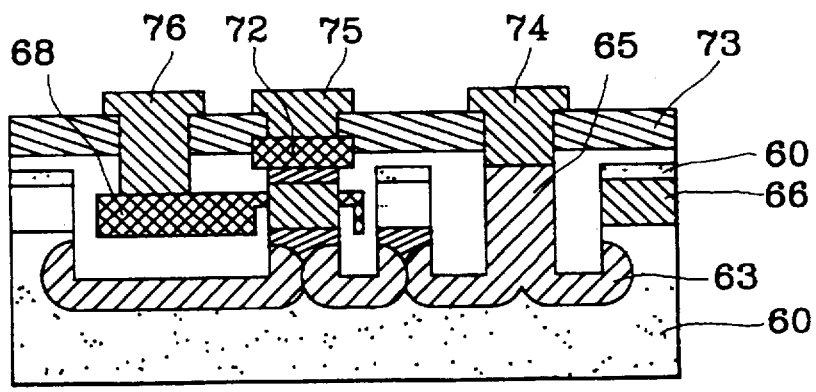

Thereafter, as shown in FIG. 9, an oxide film 73 having a thickness of 0.5 to 1 μm is deposited on the entire surface of the surface.

In addition, after exposing the polysilicon base contact electrode 68, the polysilicon emitter layer 72 and the N-type collector contact electrode 65 having high impurity density, by evaporating the metal, the metal electrode used as a collector electrode 74, the base electrode 76, and the emitter electrode 75 are formed.

As illustrated above, the structure of the bipolar transistor according to the present invention does not apply a silicon epitaxial layer as a base and an emitter region, and requires no processing for isolating elements.

The base electrode is defined automatically by the trench region, and the collector electrode is connected automatically by the diffusion of the impurities, thereby simplifying the manufacturing process and obtaining a bipolar transistor very small in size.

Additionally, as the base electrode is contacted with a part on a predetermined position, the parasitic capacitance is small. And, as it has bidirectional movement it is applied efficiently to a high integrated ECL circuit of highly speed.

Although the preferred embodiment of the present invention has been disclosed for illustrative purposes, those skilled in the art will appreciate that various modifications, additions and substitutions are possible, without departing from the scope and spirit of the invention as described in the accompanying claims.

What is claimed is:

1. A bipolar transistor, comprising:
   a conductive semiconductor substrate having first and second pillars formed in first and second trenches each having a predetermined depth for defining an activated region and a collector region;
   a conductive impurities diffusing layer formed in the semiconductor substrate at a lower portion of the first and second trenches and at an isolation wall between the first and second trenches;
   a conductive base layer formed from the first pillar;
   a self-aligned base contact electrode insulated from the conductive impurities diffusing layer, connected to the conductive base layer through a base connecting portion and formed within the first trench wherein the connecting base portion is formed between the self-aligned based contact electrode and the conductive base layer is positioned at a sidewall of the first pillar, and is positioned to contact only a part of a sidewall of the self-aligned base contact electrode within the first trench;

a conductive emitter layer formed on the base layer; and a collector contact electrode having a conductive type the same as the conductive impurities diffusing layer and formed by the second pillar of the second trench.

2. The bipolar transistor of claim 1, wherein said conductive impurities diffusing layer functions as a collector layer.

3. The bipolar transistor of claim 1, wherein said base contact electrode is formed of polysilicon.

4. The bipolar transistor of claim 1, wherein said emitter layer is formed of polysilicon.

5. The bipolar transistor of claim 1, wherein said first trench is wider than said second trench.

6. The bipolar transistor of claim 1, wherein said first pillar is wider than said second pillar.

* * * * *